United States Patent
Nysen et al.

(10) Patent No.: US 8,284,115 B2
(45) Date of Patent: Oct. 9, 2012

(54) COUPLING AND COUNTERPOISE APPARATUS FOR RADIO COMMUNICATION DEVICE

(75) Inventors: Paul A. Nysen, Bonsall, CA (US); Kevin Wolentarski, Encinitas, CA (US); Pedro A. Gutierrez, San Diego, CA (US); Chih-Chuan Yen, Escondido, CA (US); Todd Van Cleave, San Marcos, CA (US)

(73) Assignee: Sierra Wireless, Inc., Richmond, British Columbia (CA)

( * ) Notice: Subject to any disclaimer, the term of this patent is extended or adjusted under 35 U.S.C. 154(b) by 419 days.

(21) Appl. No.: 12/380,598

(22) Filed: Feb. 27, 2009

(65) Prior Publication Data

US 2009/0228608 A1    Sep. 10, 2009

Related U.S. Application Data

(60) Provisional application No. 61/032,814, filed on Feb. 29, 2008.

(51) Int. Cl.
*H01Q 1/52* (2006.01)
(52) U.S. Cl. .......... 343/851; 343/702; 343/850; 455/73; 455/90.3; 455/557; 455/575.1; 455/575.5
(58) Field of Classification Search ................. None
See application file for complete search history.

(56) References Cited

U.S. PATENT DOCUMENTS

| | | | |
|---|---|---|---|
| 4,658,266 A | 4/1987 | Doty, Jr. ................. 343/848 |
| 5,283,589 A * | 2/1994 | Blevins .................. 343/715 |
| 5,343,214 A * | 8/1994 | Hadzoglou ............... 343/713 |
| 5,475,606 A | 12/1995 | Muyshondt et al. ........... 716/19 |
| 5,495,261 A | 2/1996 | Baker et al. ................. 343/846 |
| 5,515,064 A | 5/1996 | Bacnik et al. ............... 343/860 |
| 5,867,131 A * | 2/1999 | Camp et al. ................ 343/797 |
| 5,914,696 A * | 6/1999 | Vanderhelm et al. ......... 343/841 |
| 6,157,344 A | 12/2000 | Bateman et al. ....... 343/700 MS |
| 6,215,451 B1* | 4/2001 | Hadzoglou ................ 343/715 |
| 6,266,017 B1* | 7/2001 | Aldous ................... 343/702 |
| 6,421,016 B1* | 7/2002 | Phillips et al. ............. 343/702 |
| 6,469,681 B1 | 10/2002 | Jones et al. ............... 343/906 |
| 6,476,766 B1 | 11/2002 | Cohen .................. 343/700 MS |
| 6,522,291 B1 | 2/2003 | Noguchi et al. .......... 342/357.64 |
| 6,605,775 B1 | 8/2003 | Seeber et al. .............. 174/359 |
| 6,686,886 B2 | 2/2004 | Flint et al. ................. 343/702 |
| 6,747,216 B2 | 6/2004 | Brist et al. ................. 174/262 |
| 6,870,733 B2* | 3/2005 | Castell et al. ........... 361/679.56 |
| 6,937,205 B2 | 8/2005 | Chou et al. ................ 343/841 |
| 6,966,782 B2 | 11/2005 | Wang et al. ................ 439/65 |
| 7,147,491 B1 | 12/2006 | Poilasne ................... 439/88 |
| 7,212,161 B2 | 5/2007 | Chen et al ............ 361/700 MS |

(Continued)

OTHER PUBLICATIONS

'Wireless G USB Network Adapter' User Manual by Belkin, copyright 2004, Belkin Corporation.*

(Continued)

*Primary Examiner* — Steven Snyder
(74) *Attorney, Agent, or Firm* — King & Spalding

(57) ABSTRACT

The present invention provides an apparatus for coupling a radio communication device to a host system. The apparatus comprises a housing including a counterpoise operatively coupled to the radio communication device. The apparatus also comprises a signal pathway operatively coupling the radio communication device to the host system. The apparatus thereby provides a counterpoise for the radio communication device which is external to both the host system and the radio communication device.

21 Claims, 9 Drawing Sheets

U.S. PATENT DOCUMENTS

| | | |
|---|---|---|
| 7,230,571 B2 | 6/2007 | Gaucher et al. ........ 343/700 MS |
| 7,991,433 B2* | 8/2011 | Mellage et al. ............... 455/557 |
| 2001/0054985 A1* | 12/2001 | Jones et al. ................... 343/906 |
| 2002/0000938 A1* | 1/2002 | Hoashi et al. .......... 343/700 MS |
| 2003/0227572 A1* | 12/2003 | Rowser et al. ................ 348/725 |
| 2004/0192419 A1* | 9/2004 | Chen et al. ................. 455/575.1 |
| 2004/0240191 A1 | 12/2004 | Arnold et al. ................. 361/800 |
| 2005/0007290 A1* | 1/2005 | Aisenbrey .................... 343/797 |
| 2006/0264102 A1 | 11/2006 | Poilasne .................. 439/607.01 |
| 2007/0035452 A1 | 2/2007 | Lin et al. ....................... 343/702 |
| 2007/0044145 A1 | 2/2007 | Kurian et al. ..................... 726/9 |
| 2007/0152893 A1* | 7/2007 | Chiang et al. ................. 343/702 |
| 2008/0102760 A1* | 5/2008 | McConnell et al. ............ 455/73 |
| 2009/0225819 A1 | 9/2009 | Nysen et al. ................... 375/222 |

OTHER PUBLICATIONS

'Getting the Most from Your Hand-Held Transceiver' by C. Edward Harris, copyright 1998, 1999 VARI.*

'Universal Serial Bus Specification' Revision 2.0, Apr. 27, 2000, pp. 87-92, 102.*

'Super Cantenna Wireless Booster Antenna' by Wireless Garden, Inc. from web archive Feb. 26, 2007.*

\* cited by examiner

FLAT U TRAP

FLAT S TRAP

EDGE U TRAP

EDGE S TRAP

HELIX TRAP

DIRECT TRAP

COUPLING AND COUNTERPOISE APPARATUS FOR RADIO COMMUNICATION DEVICE

RELATED APPLICATIONS

This application claims priority to U.S. Provisional Patent Application No. 61/032,814 filed Feb. 29, 2008 and entitled "Radio Communication Apparatus." The complete disclosure of the above-identified priority application is hereby fully incorporated herein by reference.

FIELD OF THE INVENTION

The present invention pertains in general to radio communications systems and in particular to a coupling apparatus between a host system and a radio communication device which provides a counterpoise for the radio communication device.

BACKGROUND OF THE INVENTION

In the field of radio communications, transceiver products are available which package a radio antenna along with the electronics necessary for its operation to provide convenient wireless, radio transceiver capabilities. For several reasons, such products are often subject to conflicting size requirements. For example, it is desirable that wireless transceivers for use with cellular telephones or personal computing devices should be sized for portability and convenient user experience. However, depending on the radio operating frequencies and required signal strengths involved, the products must exceed a certain minimum size in order to accommodate radio antennas of appropriate physical dimensions.

The limitations of conventional wireless transceiver products can be illustrated with particular respect to current wireless adapter systems, which provide plug-in wireless communications capabilities to a host system such as a laptop computer. Common wireless adapters of this type may operate for example similarly to a cellular telephone or wireless network interface, having a wired data port for connection to a host system and including a radio transceiver. Such wireless adapters can therefore be considered to include three distinct parts, a data port, an intermediate electronics package, and an antenna.

For example, a wireless adapter of this type can be connected to provide wireless capabilities to a host computer through a standard interface such as a PCI, PCMCIA, Express Card, Firewire or USB interface. In the case of PCI, PCMCIA and Express Card interfaces, the adapter electronics section is typically located or enclosed substantially within a slot of the host system, and the antennas are located on a portion of the adapter external to the slot. In the case of a USB interface, the adapter electronics and antenna are typically both contained in a package external to the host system since the USB interface is only a relatively small connection port. The wireless adapter can also comprise one or more movable antenna portions which can increase design flexibility.

A problem with such wireless adapters is that it is often difficult to satisfy radio performance requirements simultaneously with small size requirements, for example to provide adequate radio performance with a convenient, low cost and portable unit. This can be especially challenging when a larger radio transceiver would be an asset, for example to provide radio performance at relatively lower frequencies, to provide increased power for radio transmission or reception, or to provide for multiple antennas such as can facilitate performance improvements due to diversity, multiple frequency operation, or separation of radio functions.

One approach to the above problem is to design specialized antenna structures inside the wireless adapter. By providing antenna elements having adequately precise dimensions and features, improved radio performance in certain predetermined frequency bands can be provided even within a small package. For example, in the case of a monopole antenna, an antenna body within the package, such as a patch antenna or a planar inverted F antenna (PIFA), can be radiated against a ground plane also contained within the package, for example the electronics ground plane connected through the data port to a host device. For example, United States Patent Application Publication Nos. 2007/0035452 and 2007/0044145 both describe a USB wireless adapter having an antenna radiating against an internal ground plane. In the case of a dipole antenna, two antenna bodies contained in the package radiate in combination. In each case, the dimensions of the antenna bodies and the effective antenna length are limited by the dimensions of the wireless transceiver package. In both cases, antenna dimensions and details can be important to operation. For example, self-similar antenna elements such as spiral or fractal elements can be tuned to offer adequate antenna performance at a variety of radio frequencies. However, design of such precision elements can be expensive, and the effective antenna power can still be limited due to size constraints.

Another approach to the above problems is to account for the external environment when designing antenna systems for wireless adapters. In particular, the environment near or even within the wireless adapter may contain electromagnetic elements such as electronics, ground planes, passive and active electromagnetic bodies, laptop components, and the like, which may interact or interfere with the wireless adapter radio components. To the extent that it is possible to predict and plan for these elements, their presence can be accounted for to design a radio communication apparatus with improved radio performance.

However, a potential drawback to designing a wireless adapter for a particular environment is that it may be substantially limited to that environment. For example, as illustrated in FIG. 1, a USB wireless adapter 100 may be specifically designed to be plugged directly into the side of a host such as a laptop computer 110. The USB wireless adapter may further be configured for operation in close proximity with metallic elements of the computer, for example in proximity to a laptop ground plane. However, performance of such a wireless adapter may significantly degrade if the adapter is not plugged directly into the host. For example, by using a cable to connect the wireless adapter to the host in order to place the adapter in a different position such as near a window to improve reception, or away from the laptop so as to reduce the specific absorption rate (SAR) of radio energy with respect to a user. In addition, use of a host with insufficient or excessive metallic elements may result in degradation of radio performance. Thus, adapting a wireless adapter for use in a predetermined environment may reduce its ability to be used in other environments.

Another constraint in the design of wireless communications packages comprising both electronics and radiating antenna bodies is that grounded and/or shielded components are often required, both to facilitate operation of the electronics, and to provide isolation between the electronic components and the antenna. However, such grounded components can also operate for example as de-tuning and de-sensing elements for the antenna, thereby compromising antenna operation.

Another potential drawback to operating a wireless adapter in close proximity to the host system, for example plugged directly into the host system, is that the electronics of the host system may interfere with operation of the wireless adapter.

Another potential drawback to operating a wireless adapter in close proximity to the host system such as a laptop is that the wireless adapter may also be in close proximity to a user, such that radiation from the wireless adapter may be absorbed at a rate exceeding a prescribed maximum specific absorption rate (SAR).

Therefore there is a need for a wireless communications system for coupling with an external system, such as a wireless adapter, that is not subject to one of more limitations of the prior art.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a coupling and counterpoise for radio communication apparatus. In accordance with an aspect of the present invention, there is provided an apparatus for coupling a radio communication device to a host system, the apparatus comprising: a housing including a counterpoise, said counterpoise operatively coupled to the radio communication device; and a signal pathway operatively coupling the radio communication device to the host system, the apparatus thereby providing a counterpoise for the radio communication device which is external to the both host system and the radio communication device.

DETAILED DESCRIPTION OF THE INVENTION

Definitions

Figure 1:
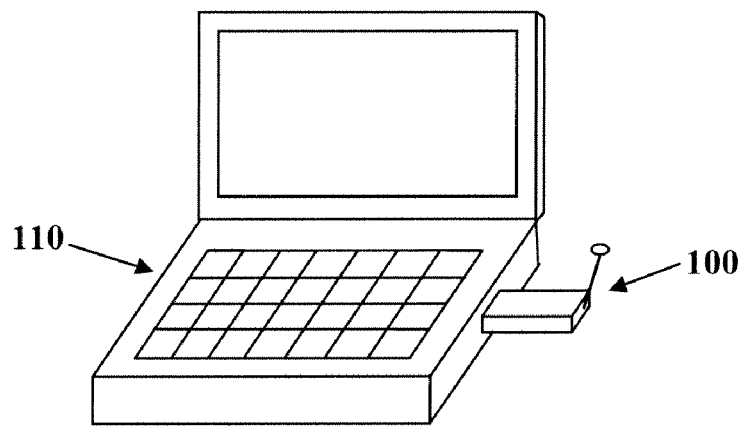
FIG. 1 illustrates a radio communication apparatus coupled to a host system in accordance with the prior art.

The term "electromagnetic field" refers to an electric field, a magnetic field, or a combination thereof. More particularly, an electromagnetic field describes the strength of force interaction between stationary charged objects or moving charged objects at a distance. For example, an electromagnetic field can be employed to describe the interaction of antennas and/or other bodies in radio communications. As another example, electrical currents and voltages in a conducting body can be described in terms of electromagnetic fields within and around the conducting body. Electromagnetic fields can be either constant or time varying.

The terms "electromagnetic body", "radiating body", and "antenna" are used to define a conducting body, or outside skin or surface thereof, or arrangement of conducting bodies that radiates an electromagnetic field, as into free space, in response to an electrical or electromagnetic excitation applied thereto, or equivalently a conducting body or arrangement of conducting bodies that produces an electrical excitation in response to an electromagnetic field, whenever such an electromagnetic field and electrical excitation is significant to some purpose. Either or both of radio transmission and reception operations can be performed by an antenna.

The terms "ground plane" and "counterpoise" refer to an electromagnetic body or radiating body which acts in conjunction with another radiating body to form an antenna, wherein the ground plane or counterpoise is not directly coupled to an electronics system, but is electromagnetically coupled (interacting via an electromagnetic field) with the other radiating body through a relatively non-conductive material or free space. The radiating body and ground plane or counterpoise together comprise an antenna, the ground plane or counterpoise operating by passive electromagnetic reflection. A ground plane is generally a structure which enables operation of an antenna by providing an electromagnetic reference having desirable properties such as absorption and re-radiation, reflection, and/or scattering of electromagnetic radiation over a predetermined frequency range. A ground plane is not necessarily "earth ground." In a printed circuit board, a ground plane may for example comprise a layer of conductive material covering a substantial portion of the printed circuit board. A counterpoise, as generally defined in antenna systems, can be a structure which is used as a substitute for a ground plane, for example having a smaller size than an equivalent ground plane but with a strategically designed structure which enables the counterpoise to effectively emulate such a ground plane. A counterpoise may be regarded as a type of ground plane. A counterpoise may also provide a return current path for the antenna, and/or act as a counterbalance for the antenna feedpoint, thereby potentially reducing reflection of electromagnetic radiation back to the electronics.

The term "wave trap" is defined herein as an electrical or electromagnetic structure that blocks or at least impedes passage of a specified class of wanted or unwanted electrical or electromagnetic signals through the material of the wave trap. An example of a wave trap is a low-pass filter, which allows signals having a frequency below a given cut-off frequency to pass, while blocking signals having a frequency higher than the cut-off frequency. A wave trap may comprise a "U" shaped conductor having length about equal to an odd integer multiple of quarter wavelengths of an operating frequency. Alternatively, a wave trap may comprise an "S"-shaped, direct or substantially straight, or helically shaped portion having analogously defined dimensions. Other wave traps would be readily understood by a worker skilled in the art, for example a wave trap fashioned using isolated transformers, autotransformers, inductors, or capacitors, or a combination thereof. A ferrite bead or other magnetic structure near a conductor can act as a wave trap. A wave trap can also be referred to as an isolator or a choke as it can function to isolate electrical or electromagnetic components by preventing electromagnetic coupling through the wave trap at one or more predetermined frequencies.

The terms "reactance", "resistance", "inductance", and "capacitance" are defined as characteristics of electrical impedance. In radio systems, it is known that many structures cannot be characterized by a single one of these terms, but may exhibit properties of several. It is understood that when such a term is used herein, it is meant to highlight a property of an electrical structure, without excluding the possibility that other properties may be present. Electrical impedance can be associated with the behaviour of electromagnetic fields within a structure, or alternatively with associated phenomena such as voltage and current.

The term "transceiver" is used to refer to a radio communication system that performs operations related to either or both of radio transmission and reception by leveraging electromagnetic coupling between antennas. A transceiver typically includes one or more antennas, and electronics operatively coupled to an antenna to translate between electromagnetic radiation in the antenna and a local analog or digital signal representative of data encoded into the electromagnetic radiation.

The term "Faraday cage" is used to refer to an electromagnetic enclosure for isolation of electrical components. A Faraday cage typically comprises several conductive surfaces, or surfaces having a mesh of conductive material, enclosing a shielded area. The Faraday cage is a conductive enclosure having two distinct types of surfaces, namely inside surfaces and outside surfaces. The conductive surfaces are configured to substantially block electric fields and electromagnetic radiation at selected frequencies, such that electromagnetic coupling, for example capacitive or inductive coupling, between elements interior to the Faraday cage and elements exterior to the Faraday cage is substantially reduced or eliminated and vice versa.

As used herein, the term "about" refers to a +/−20% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

The present invention provides an apparatus for coupling a radio communication device to a host system. The apparatus comprises a housing which includes a counterpoise. The counterpoise is operatively coupled to the radio communication device, for example via a radio interface and/or through electromagnetic field interaction. The apparatus further comprises a signal pathway operatively coupling the radio communication device to the host system. The apparatus thereby provides a counterpoise for the radio communication device which is external to the both the host system and the radio communication device.

Figure 2:
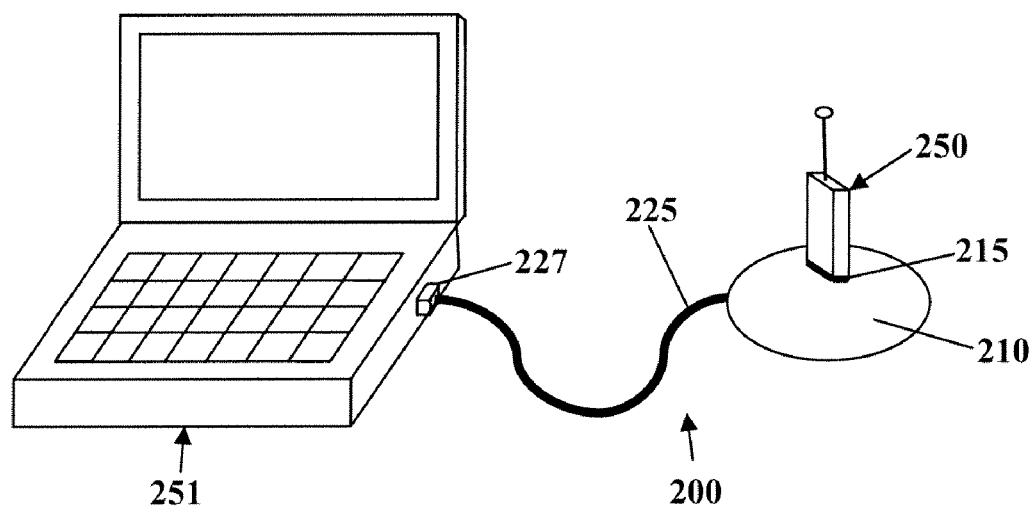
FIG. 2 illustrates a coupling and counterpoise apparatus between a radio communication apparatus and a host system in accordance with one embodiment of the present invention.

FIG. 2 illustrates an apparatus 200 for coupling a radio communication device 250 such as a wireless adapter to a host system 251 such as a laptop in accordance with an embodiment of the present invention. The apparatus 200 comprises a housing 210 and a signal pathway. In the present embodiment the signal pathway includes a plug-in connector 215 for the wireless adapter, a cable 225 and a plug-in computer connector 227. In embodiments, the signal pathway can also include a wave trap (not shown). The housing 210 includes a counterpoise (not shown), such as one or more metallic or electromagnetically reflective or reactive and/or electrically conductive elements. In some embodiments, at least a portion of the counterpoise is integral to the outer portion of the housing 210. In other embodiments, at least a portion of the counterpoise is contained within the outer portion of the housing 210.

In some embodiments, the plug-in connectors 227 and 215 are mating male and female connectors, such as USB connectors. In this manner, the apparatus 200 can be interposed between the radio communication device 250 and the host system 251 which would otherwise directly couple to each other as illustrated in FIG. 1. For example, the radio communication device 250 can include a male USB connector for coupling to a corresponding female USB connector of the host system 251. The plug-in connector 215 can then be substantially the same shape as the female USB connector, while the plug-in connector 227 can be substantially the same shape as the male USB connector.

For example, the present invention can provide increased flexibility when using a radio communication device such as a wireless device with a host system such as a laptop computer. For example, the present invention can facilitate using a wireless adapter with a laptop when the laptop is interfaced with a docking station. The present invention can further provide more flexible placement of the radio communication device with respect to the host system, thereby offering potential for improved performance and/or reduced specific absorption rate (SAR) by facilitating freedom to place the radio communication device in a favourable location.

Figure 3:
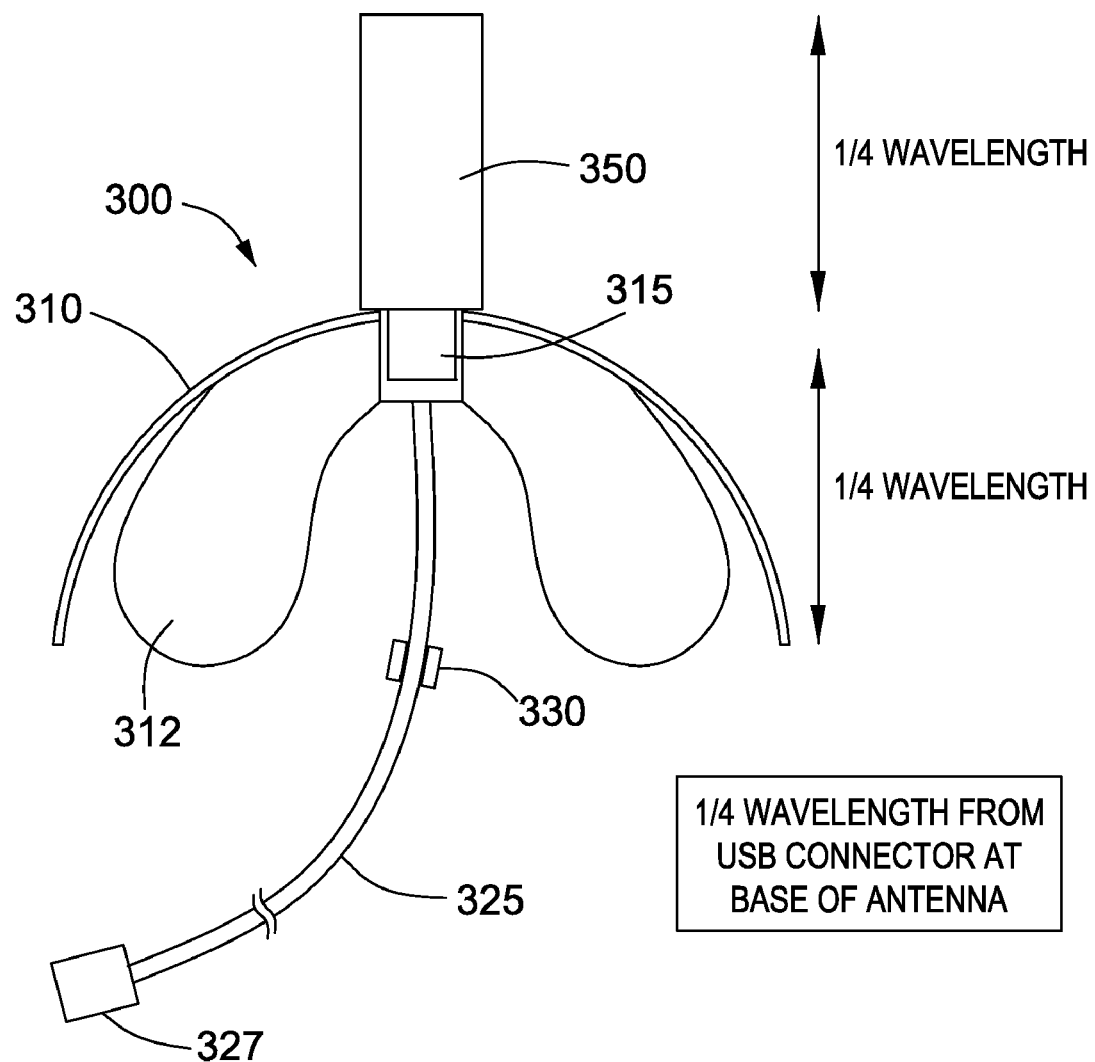
FIG. 3 illustrates a cross section of a coupling and counterpoise apparatus according to one embodiment of the present invention.

FIG. 3 illustrates a cross sectional view of an apparatus 300 for coupling a radio communication device 350 to a host system in accordance with an embodiment of the present invention. The apparatus 300 includes a plug-in connection 315 such as a USB connector for interfacing with the radio communication device. The plug-in connection 315 is further coupled to a cable 325 which is in turn coupled to another plug-in connection 327 such as a USB connector for interfacing with the host system. A signal pathway of the device 300 may include the plug-in connections 315 and 327, and one or more conductors of the cable 325. A wave trap or isolation trap 330 such as a ferrite bead is shown placed on the cable 325 such that the distance between the wave trap 330 and the radio communication device 350 is substantially equal to one quarter of an operating wavelength of the radio communication device 350. In one embodiment the cable 325 can further comprise a cable shielding over conductors thereof. The operating wavelength can be, for example, the wavelength corresponding to a center operating frequency used for radio communication by the device 350. The apparatus 300 further comprises a housing 310, which operates to hold the radio communication device 350 in a desired position, and further includes elements such as the plug-in connection 315 and a counterpoise 312. The counterpoise 312 is illustrated as being contained within the outer portion of the housing 310. The counterpoise 312 includes an electromagnetically reactive surface such as a solid metallic surface, metallic mesh, or wire wrapping for example. The counterpoise 312 is shaped to facilitate its operation in conjunction with the radio communication device 350. For example, the counterpoise 312 as illustrated has a height substantially of one quarter of an operating wavelength of the radio communication device, and a width greater than that of the radio communication device.

For example the width may be on the order of about half of the operating wavelength. The counterpoise 312 illustrated in FIG. 3 includes "tear-drop" shaped lobes in cross section, which is considered to facilitate adequate performance of the counterpoise over a range of operating frequencies.

Housing

The present invention provides a housing which includes and/or houses components of the invention. The housing can comprise rigid, semi-rigid or resilient materials such as plastics, ceramics, organic materials, or the like. In some embodiments, the housing can comprise metallic material operating as a counterpoise integral to the housing. In one embodiment, the housing provides a convenient structure which holds components of the invention together in an attractive package.

In some embodiments, the housing provides a physical enclosure or cavity which contains a counterpoise or other passive electromagnetic body, thereby including the counterpoise. The counterpoise may be physically held in place within the housing by direct contact with the housing at one or more points, or via intermediate support structures such as rods connected to the housing and to the counterpoise, as would be readily understood by a worker skilled in the art.

In some embodiments, the housing includes a counterpoise integral to the housing. For example, part or all of the housing can be an electromagnetically active body which operates as a counterpoise or passive electromagnetic body in accordance with the present invention.

In some embodiments, the housing may be a structure such as a plastic or rubber coating applied to a rigid counterpoise body. In this case, the housing itself may provide relatively little rigidity in comparison to the counterpoise.

In some embodiments, the housing is adapted to be fastened onto an appropriate surface such as a laptop monitor or other adequately shaped body. For example, the housing may include a clip mechanism adapted to grip a surface. Such a clip mechanism may include resilient material and two projecting surfaces defining a cavity, wherein the cavity accepts a surface to which the housing is to be fastened, and the two projecting surfaces grip the surface, for example by a spring mechanism. Other fastening and/or clipping mechanisms which can be used in the present invention for frictionally engaging a surface would be understood by a worker skilled in the art. For example, the housing may include a plastically deformable section which can be wrapped around a surface thereby holding the housing in place.

In some embodiments, the housing includes an interface providing a physical coupling to the radio communication device. The interface may also provide electrical and/or electromagnetic coupling between the radio communication device and the counterpoise and/or signal pathway. The interface may include a plug, slot, clip or other fastening mechanism which engages the radio communication device to hold it in a desired position relative to the housing. For example, the interface may include a plug or mating connector such as a USB plug for frictionally engaging a radio communication device such as a wireless adapter. In one embodiment, the housing thereby acts as a stand for holding the radio communication device in a desired position, for example to orient the antenna in a desired direction. In a further embodiment, the housing may be adapted to pivot, swivel, tilt, or bend in order to adjustably orient the antenna.

In some embodiments, the housing includes additional electronic or electromagnetic elements. For example, the housing may include a portion of the signal pathway, such as an interface to the radio communication device, and/or additional wiring or circuitry. For example, electronic or electromagnetic elements can be provided which facilitate a desired coupling, or block an undesired coupling, between the radio communication device and the counterpoise, or between the radio communication device and host system. Examples of such elements include impedance matching circuitry and wave traps included in the housing.

In some embodiments, the housing may be configured with respect to size, shape, weight, or other physical characteristics. For example, the weight distribution of the housing may be configured to facilitate its operation as a stand or as an adequately light clip-on housing. Physical characteristics such as size, shape and weight can also be configured for desirable features such as attractiveness and portability. In embodiments of the present invention, the stand can be foldable or deformable for portability and/or utility.

In some embodiments, the housing is configured to provide an attractive visual design. The housing can thereby make an attractive accessory to a wireless adapter.

In one embodiment, the housing can support or include further electromagnetic elements, such as one or more reflectors, directors, parabolic or other elements as would be understood by a worker skilled in the art. Such elements can passively or actively facilitate adjusting the electromagnetic field pattern of the radio communication apparatus, along with the related transmission and/or reception characteristics thereof.

Counterpoise

The housing of the present invention includes a counterpoise which is configured for operatively coupling to the radio communication device. For example, the counterpoise may electromagnetically couple to an antenna of the radio communication device, thereby facilitating operation thereof. As described above, the counterpoise may be contained within the housing or may be integral to all or part of the housing. In one embodiment, the counterpoise may be integral to a clip portion of the housing.

A counterpoise provided according to embodiments of the present invention may provide improved communication capability of a radio communication device such as a wireless adapter. This improvement may be manifested to the user for example as one or more of: increase communication range, improved link reliability, reduced delay, and higher data rates.

In embodiments of the present invention, the counterpoise is configured to have electrical and/or electromagnetic properties facilitating its operation as a passive electromagnetic body. For example, the counterpoise can be constructed of a metallic or composite material such as a metal sheet, wire mesh, conductive or semiconductive matrix, collection of meandering, wound, or fractally arranged conductors, or the like.

In embodiments of the present invention, the size, shape and/or make-up of the counterpoise may be configured such that the counterpoise operates adequately with respect to a predetermined range of radio characteristics. For example, the counterpoise can be configured to operate adequately in a predetermined radio frequency range and/or bandwidth, or further with a predetermined range of electromagnetic field strengths. The predetermined range of radio characteristics can be commensurate with a predetermined collection of radio communication apparatus, such as a predetermined set of wireless adapters with known characteristics.

In some embodiments, the counterpoise is dimensioned to adequately operate over an adequately wide bandwidth which includes at least one operating frequency of the radio communication apparatus. For example, the height of the counterpoise can be about one quarter of a wavelength of an operating frequency of the radio communication apparatus, such as the lowest frequency used thereby. In one embodiment, the width of the counterpoise can also be dimensioned, for example, such that the counterpoise extends in a direction perpendicular to the antenna to a distance of at least about one quarter of a wavelength of an operating frequency of the radio communication apparatus, such as the lowest frequency used thereby.

In one embodiment, the counterpoise 312 as illustrated in FIG. 3 can be shaped such that an arbitrary cross section thereof has lobes resembling a "tear drop" shape. The height and width of each tear drop can be substantially one quarter of a wavelength of the lowest operating frequency of the radio communication apparatus. This shape can be well-adapted to the present invention when compared to other arbitrary shapes. In other embodiments, the "tear drop" shaped lobes of the counterpoise 312 can be adjusted or varied to provide a compromise between appearance, physical utility, and electromagnetic performance.

In operation, the counterpoise is electromagnetically coupled to a radiating body of the radio communication apparatus. The counterpoise reacts to the electromagnetic field of the radiating body, for example absorbing and re-radiating electromagnetic radiation, focusing or reflecting radiation of the radio communication apparatus, resonating in sympathy with a radiating body of the radio communication apparatus, providing ground return paths, or other operations of a counterpoise and/or ground plane as would be readily understood by a worker skilled in the art.

In some embodiments, the radio communication apparatus includes a radiating body corresponding to a monopole antenna, which operates in conjunction with a counterpoise in operation. The counterpoise may thereby act to balance the electromagnetic currents associated with operation of the monopole antenna.

Electromagnetic coupling of the counterpoise and the radiating body may include coupling through free space or air or other ambient insulating material, coupling through the radio interface of the signal pathway, and/or coupling through an impedance matching element, wave trap, or other electrical or electromagnetic element.

In some embodiments, the counterpoise is electrically coupled to ground. For example, the counterpoise may be coupled via a ground pathway of the signal pathway to a ground plane of the host system. This may facilitate operation of the counterpoise by providing a path for ground currents during radio operation.

Signal Pathway

The present invention provides a signal pathway operatively coupling the radio communication device and the host system. The signal pathway facilitates co-operation of the radio communication device and the host system. For example, for a radio communication device which is a wireless adapter and a host system which is a personal computer or laptop computer, the signal pathway operates to allow the wireless adapter to perform communication tasks for the host system.

In some embodiments, the signal pathway includes a data pathway, such as one or more digital data pathways. For example, the data pathway can comprise serial or parallel paths, such as electrically conductive or optical paths. Such paths can operate using differential or single-ended signalling, for example. In embodiments of the present invention, the data pathway can operate according to a known standard, such as USB or Firewire.

In one embodiment, the signal pathway includes an analog pathway, such as a radio frequency (RF) transmission pathway. For example, an analog pathway can be provided using a coaxial cable, optical fibre, microstrip or stripline structure, or one or more conductors such as wires or circuit traces. Such an analog pathway may be used to convey information and instructions between the host system and radio communication device. The analog pathway may be used to convey a baseband signal which is modulated or demodulated by the radio communication apparatus.

In some embodiments, the signal pathway includes a power pathway, which is configured to supply power from the host system to the radio communication device. For example, the power pathway can include the +5V power supply line of a USB connection, or the potentially higher voltage power supply line provided by Firewire.

In some embodiments, the signal pathway includes a ground pathway, which is configured to connect a ground plane of the host system with a ground plane of the radio communication device and/or counterpoise. In one embodiment, the ground pathway operates as a reference for the signal pathway. In one embodiment, the ground pathway operates as a ground current return path facilitating operation of an antenna or electronics of the radio communication device, or of the counterpoise. In one embodiment, the ground pathway may also be considered part of the power pathway, as it operates in conjunction with power lines of the power pathway to establish a potential difference usable for operation of the radio communication apparatus.

In some embodiments, the signal pathway includes one or more flexible conductors, such as found in a standard computer cable. The cable can include strain relief, electrical shielding, electrical insulator, physical shielding, and/or other features as would be readily understood by a worker skilled in the art.

In one embodiment, the signal pathway includes a short-range wireless communication pathway, such as facilitated by a Bluetooth or ZigBee communication system.

In embodiments of the present invention, the signal pathway facilitates flexibility of placement of the radio communication device at a desirable position relative to the host system. For example, the signal pathway can include a cable of sufficient length that a radio communication device such as a wireless adapter, normally plugged directly into the host system, can be moved to a more desirable location. For example, the radio communication device can be placed near a window or within line of sight of another communication device. The signal pathway may further facilitate orientation of the radio communication device such that an antenna thereof can be oriented in a desired direction, for example to take advantage of horizontal or vertical polarizations to enhance communication. The signal pathway may further facilitate placement of the radio communication device away from a user so as to reduce the specific absorption rate for that user due to radiation from the radio communication device.

In some embodiments, the signal pathway includes a radio interface and a host interface. For example, plug-in connectors can be provided at either end of the signal pathway for connecting elements of the signal pathway to corresponding elements of the host system and radio communication device. The present invention can include but is not limited to standardized electronics connections such as male and female type A and type B USB connectors, mini and micro USB connectors, Firewire connectors, PC card, PCMCIA, and the like. In one embodiment, the present invention can comprise various connection adapters to provide increased flexibility for connecting to different types of host system or radio communication system ports.

In some embodiments, the signal pathway includes a wave trap. For example, a ferrite bead or other wave trap can be positioned at a distance of about one quarter of a wavelength of an operating frequency from the radio communication device. For example, the operating frequency can be the lowest radio frequency used by the radio communication device. A wave trap included in the signal pathway can reduce potential for the conductors of the signal pathway to adversely affect radio operation, for example by detuning antennas of the radio communication device. Embodiments of the present invention may include other means of reducing adverse effects of the signal pathway on electromagnetic operation of the radio communication device and/or counterpoise, for example Faraday cages, optical isolators, RF chokes, and the like.

In some embodiments, the signal pathway includes other electronic, electromagnetic and/or optical components, such as signal conversion, optical isolators, impedance changing or matching circuitry, filters, voltage or current transformers, and the like. The signal pathway can thereby operate to substantially convert or filter portions of the signals thereof. The signal pathway may include printed circuit board components, discrete or integrated circuit components, or other elements.

Operation with a Radio Communication Device

In embodiments of the present invention, a coupling and counterpoise apparatus is configured to operate with a radio communication device comprising a radio electromagnetic body configured to operate as a monopole antenna element in conjunction with the counterpoise of the coupling and counterpoise apparatus. In one embodiment, the radio communication device may comprise a radio electronics system and a radiating body, and an internal signal pathway operatively coupling the radio electronics system with the radio interface of the coupling and counterpoise apparatus. The radio communication device may further comprise a conductive enclosure configured to provide electromagnetic isolation between the signal pathway and the radio electromagnetic body. The conductive enclosure may be configured to at least partially impede electromagnetic coupling between the radio electromagnetic body and the counterpoise of the coupling and counterpoise apparatus.

In some embodiments, the conductive enclosure of the radio communication device may be coupled to a conductive enclosure of the coupling and counterpoise apparatus, enclosing the signal pathway thereof. In a further embodiment, the conductive enclosure can provide a substantially continuous enclosure around the signal pathway between the radio interface and host interface, thereby providing a Faraday cage between the host computer system and radio electronics system.

In some embodiments, the conductive enclosure of the radio communication device may be configured to impede electromagnetic coupling between the radio electromagnetic body and the counterpoise by inclusion of a wave trap. For example, the conductive enclosure can include a "U"-shaped, "S"-shaped, direct or substantially straight, or helically shaped portion operating as a wave trap. In this manner, the conductive enclosure can be configured to impede an RF pathway at one or more frequencies of radio operation by acting as a wave trap or high-impedance element substantially at those frequencies.

In some embodiments, the inclusion of the wave trap facilitates differential excitation of the counterpoise and the radio electromagnetic body. In addition, since the wave trap can substantially impede electromagnetic coupling in a predetermined range of frequencies, a path can be introduced in parallel to the wave trap which can be configured to establish a desired level of electromagnetic coupling in the desired range of frequencies, as required for antenna operation.

In some embodiments, a coupling element can be provided across the wave trap of the conductive enclosure, to provide an impedance match between portions of the radio electronics system coupled to the radio electromagnetic body, and/or to facilitate a predetermined impedance between the radio electromagnetic body and the counterpoise. In this manner, the radio electromagnetic body can be efficiently coupled to portions of the radio electronics system configured to transmit and/or receive radio signals via an antenna comprising the radio electromagnetic body.

In some embodiments, the coupling element can comprise a transmission path parallel to at least a portion of the signal pathway, for example between the radio electronics system and the counterpoise. The parallel transmission path can be established using a transmission line originating from the radio electronics system, which may be inside the radio electromagnetic body, wherein the transmission line coupled across to the counterpoise. For example, the transmission line can be coupled to the counterpoise through one or more elements such as resistive, capacitive, inductive or like elements, which may bridge over the wave trap and use a remaining portion of the conductive enclosure of the radio communication apparatus, namely the portion excluding the wave trap, as a coupling. A portion of the conductive enclosure of the coupling and counterpoise apparatus, and/or transmission line or other conductive element of the coupling and counterpoise apparatus, may be configured to couple the conductive enclosure of the radio communication apparatus and the counterpoise. Resistive, capacitive, inductive or like elements can provide a predetermined impedance for an appropriate coupling or impedance match.

In some embodiments, additional impedance matching can be provided between the radio electromagnetic body and a transmission line operatively coupling the radio electromagnetic body to the radio electronics system, and/or a transmission line operatively coupling the radio electromagnetic body to the counterpoise. Such impedance matching is common in radio design to ensure efficient transfer of electromagnetic energy between the radio electromagnetic body, the transmission line, and the radio electronics system. For example, impedance matching circuitry can involve inductive and capacitive elements connected in a combination of series and parallel connections between the radio electromagnetic body, the transmission line, and the host electromagnetic body. For this purpose, inductive and capacitive elements can be provided as discrete components or distributed structures included in the coupling element between the radio electromagnetic body, the transmission line, and the counterpoise, as would be understood by a worker skilled in the art.

In some embodiments, additional radio electromagnetic body antenna elements can be provided within or attached to the radio module or apparatus housing. For example, a diversity antenna system employing at least one of modal, spatial, pattern, or polarization diversity can be provided in this manner. The diversity antenna can be provided as a notch, slot or cavity within the radio electromagnetic body. The counterpoise of the present invention may operate in conjunction with one or more of these antenna elements.

The invention will now be described with reference to specific examples. It will be understood that the following examples are intended to describe embodiments of the invention and are not intended to limit the invention in any way.

EXAMPLES

Example 1

Figure 4A:
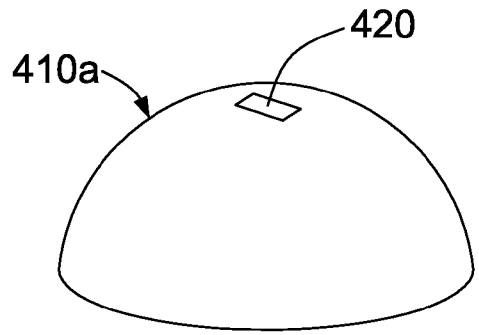
FIGS. 4A to 4F illustrate housing and/or counterpoise configurations of a coupling and counterpoise apparatus according to various embodiments of the present invention.
Figure 4B:
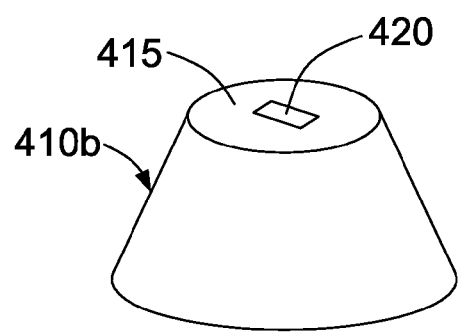
Figure 4C:
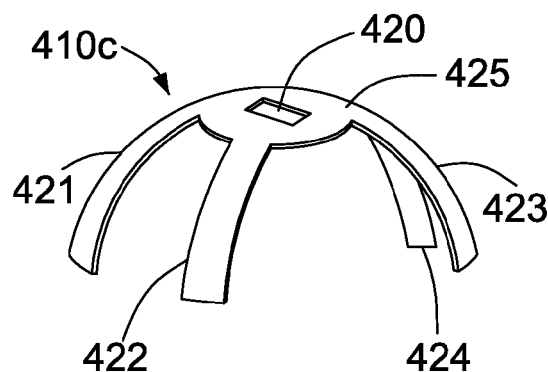
Figure 4D:
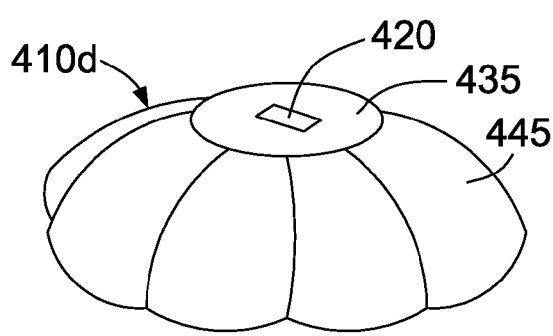
Figure 4E:
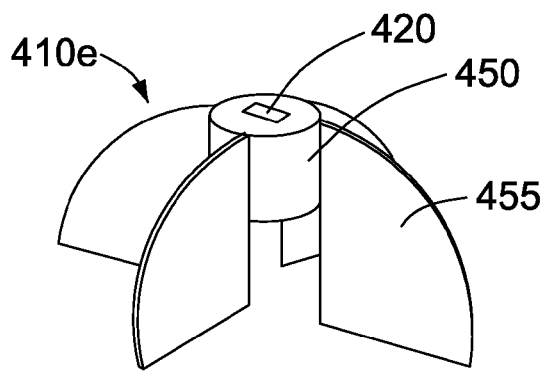
Figure 4F:
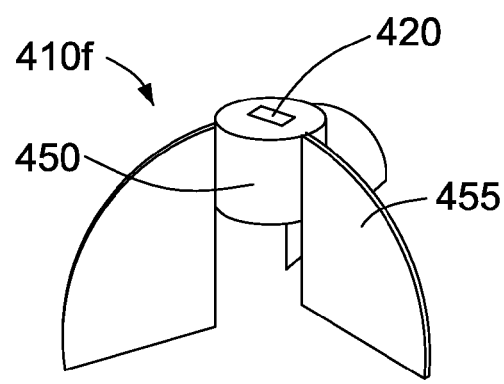

FIGS. 4A to 4F illustrate potential housing and/or counterpoise shapes according to various non-limiting embodiments of the present invention. FIG. 4A illustrates a substantially dome-shaped body 410a, for example resembling a hemisphere or paraboloid or portion thereof. FIG. 4B illustrates a substantially frustro-conical shaped body 410b with a top section 415. FIG. 4C illustrates a body 410c having four legs 421 to 424 supporting a top section 425. The body 410c may have similar contours to the body 410a, except that intermediate sections between the four legs have been removed. FIG. 4D illustrates a body 410d having a top section 435 supported by foldable side support "petals" 445 which may be foldable to make the body smaller for packing and transporting. FIGS. 4E and 4F illustrate bodies 410e and 410f, respectively, having a substantially cylindrical top section 450 supported by shaped legs 455. This design resembles the base of a rocket with fins.

A radio communication interface port 420 is provided near the top of each body 410a to 410f. The bottom of each body 410a to 410f may be adapted to rest stably on an appropriate surface.

In each of FIGS. 4A to 4F, the exterior shapes of bodies 410a to 410f are shown. The exterior may be a housing having an enclosed counterpoise or it may be a housing having an integral counterpoise. The interior of each shape illustrated in FIGS. 4A to 4F may include a counterpoise with cross-sectional shape appropriate to its operation. Cavities, circuit boards, and the like can also be provided in the interior of the housing to facilitate routing of the signal pathway.

Example 2

Figure 5:
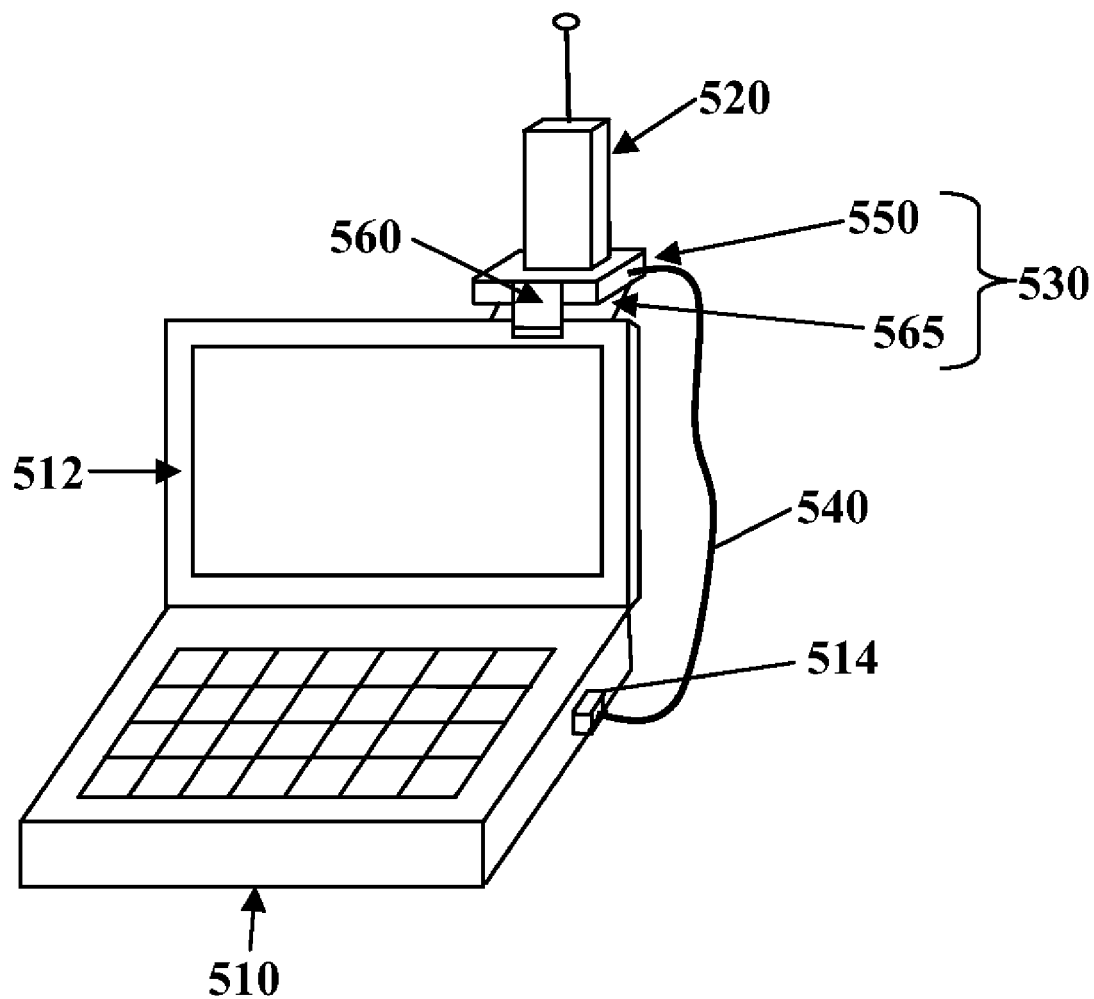
FIG. 5 illustrates a coupling and counterpoise apparatus between a radio communication apparatus and a host system in accordance with another embodiment of the present invention.

FIG. 5 illustrates an apparatus 530 clipped to the screen 512 of a host laptop 510 and holding a wireless adapter 520 in accordance with an embodiment of the present invention. The apparatus comprises a housing 550 with clip arms 560 and 565 which receive a portion of the screen 512 therebetween so as to hold the apparatus 530 mounted in place on the screen 512. In the present embodiment, the clip arms 560 and 565 are shaped so that the wireless adapter 520 can be supported in place without damage to the screen 512. The clip arms 560 and 565 can include rigid, plastic and/or elastically deformable sections. The apparatus 530 may physically and/or frictionally engage the wireless adapter 520 to hold it in place. For example, the wireless adapter 520 may be inserted into a plug or slot of the apparatus 530.

The housing 550 and/or clip arms 560 and 565 further comprise a counterpoise. For example, at least a portion of the housing 550 and/or clip arms 560 and 565 may include metallic material operating as a counterpoise. The counterpoise may be electromagnetically coupled to the wireless adapter 520 and/or the host system 510 in a manner that facilitates operation of the wireless adapter 520.

The apparatus 530 further includes a signal pathway 540 operatively coupling the wireless adapter 520 to the host system 510. For example, the signal pathway 540 may include one or more conductors inside a cable such as a USB cable plugged into the host laptop 510 at connection point 514. The signal pathway 540 may further connect to the wireless adapter 520 at an electrical connection point contained inside the housing 550.

Example 3

Figure 6:
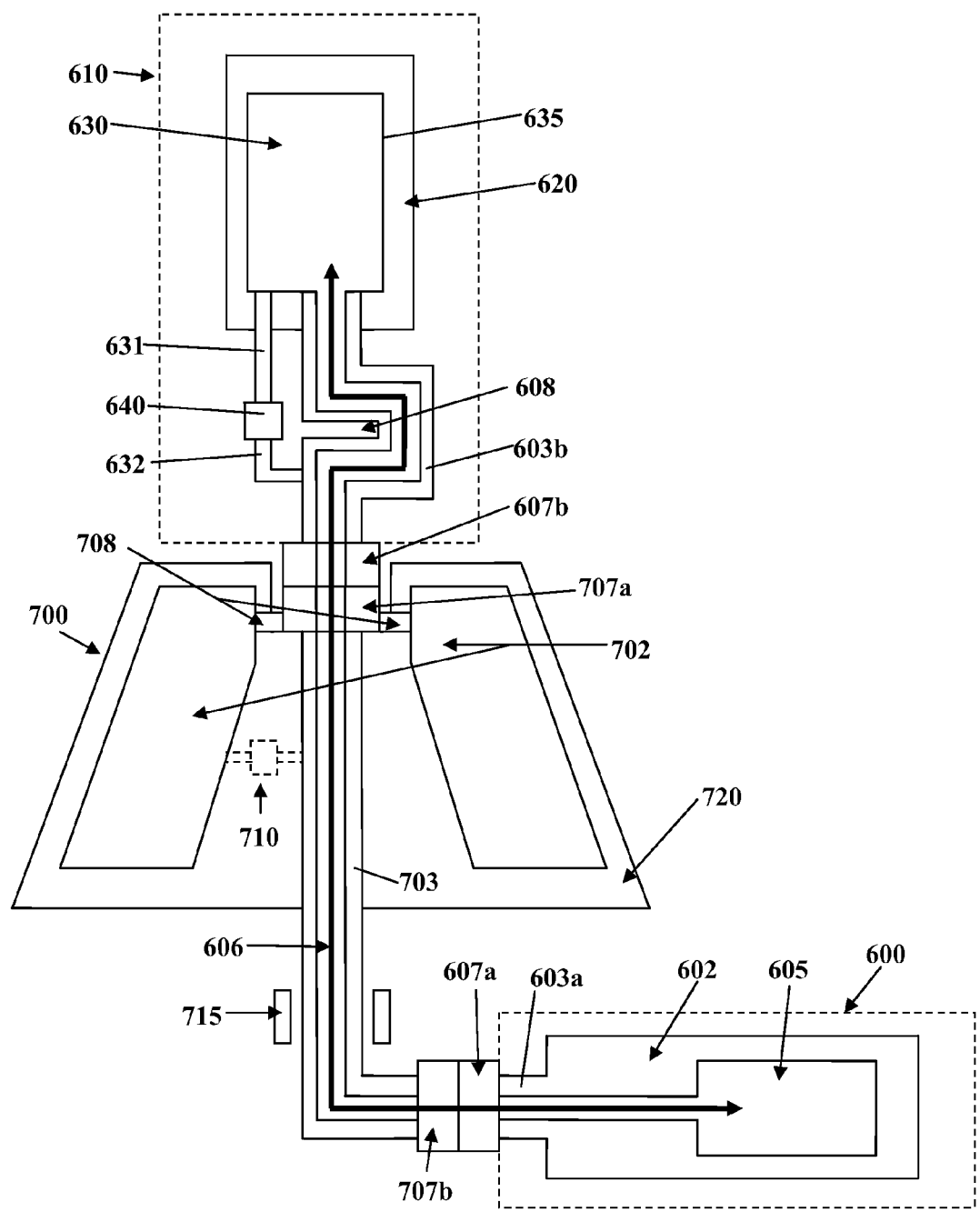
FIG. 6 illustrates a coupling and counterpoise apparatus between a radio communication apparatus and a host system in accordance with another embodiment of the present invention.

FIG. 6 illustrates an apparatus 700 coupling a radio communication apparatus package 610 with a host system 600 according to one embodiment of the present invention. The host computer system 600 can be, for example, a personal computer or portion thereof, having an integral electronics system 605 and a host electromagnetic body or ground plane 602. The host computer system 600 also includes a USB or other connection port having a mating section 607a which connects to a corresponding mating section 707b of the apparatus 700. In an alternative configuration, the mating section 607a may be connectable to a corresponding mating section 607b of the radio communication apparatus package 610. A conductive enclosure or shielding 603a is electrically connected to the ground plane 602 and extends from the host system 600 to the apparatus 700 by virtue of electrical connection through external shielding of the two mating sections 607a and 707b. The conductive enclosure further extends through the apparatus 700 to the radio communication apparatus package 610 via shielding or conductive enclosure 703 which extends to the external shielding of a mating connector 707a. The mating connector 707a further connects to mating section 607b of the radio communication apparatus package 610. The external shielding of mating section 607b further connects to a conductive enclosure 603b of the radio communication apparatus.

The conductive enclosures 603a, 703 and 603b surround at least a portion of a signal pathway 606 which couples at a first end to the electronics system 605, and which couples at a second end to a radio electronics system 630. The conductive enclosures 603a, 703 and 603b, and the external shielding of the mating sections 607a, 707b, 707a and 607b define a substantially continuous Faraday cage surrounding the signal pathway 606. In the case of a USB connection, the signal pathway 606 includes four electrical conductors, conveying power, ground, and two differential serial data lines.

The radio communication apparatus package 610 is a packaged body including a radio electromagnetic body 620 and a radio electronics system 630 operatively coupled thereto. A coupling includes a transmission line 631, an impedance matching section 640 and a conductor 632 providing a path across a wave trap 608 to a portion of the conductive enclosure 603b. This path continues through the external shielding of mating sections 607b and 707a, and through conductive portions 708 to a counterpoise 702. The conductive portions 708 may be integral to the counterpoise 702, thereby providing a direct electrical connection between shielding 707a and counterpoise 702. In one embodiment, the path may further comprise a portion of the conductive enclosure 703, and/or an additional optional coupling element 710 (shown using broken lines). The transmission line 631 can be a single conductor, or a transmission line such as a coaxial, microstrip, stripline transmission line or the like. The radio electronics system 630 is further operatively coupled internally to the signal pathway 606, which continues from the electronics system 605 through the apparatus 700 to the radio electronics system 630. In one mode of operation, the radio electronics system 630 is adapted to receive digital information from the electronics pathway 606 according to a protocol, for example a USB-compliant protocol and transmit said digital information by radio communication, including encoding, modulation, and driving of the radio electromagnetic body 620 according to protocols as would be understood by a worker skilled in the art. In another mode of operation, the radio electronics system 630 is adapted to receive digital information by radio communication, including being driven by the radio electromagnetic body 620, demodulation, and decoding according to protocols as would be understood by a worker skilled in the art, and transmit said digital information over the electronics pathway according to a protocol, for example a USB-compliant protocol.

Except for the transmission line 631, the RF impedance match 640 and the conductor 632, the radio electronics system 630 is electromagnetically shielded from the radio electromagnetic body 620 by shielding means 635 to reduce undesired noise coupling therebetween. The shielding means 635 is shown diagrammatically as a single enclosing conductor body, but can comprise one or more conducting bodies such as shield cans placed over electronic components in practice. To suppress noise and inhibit undesired electromagnetic coupling between the radio electromagnetic body 620 and the counterpoise 702 and/or ground plane 602 via the electronics pathway 606, a portion of the electronics pathway 606 within the apparatus package 610 is contained within a conductive enclosure or shielding 603b, which is coupled to the shielding 603a of the host 600 via mating sections 607b, 707a, 707b and 607a, and conductive enclosure 703 to form a substantially continuous conductive enclosure for the signal pathway 606. The shielding 603b can be printed as conductive surfaces on two layers of a printed circuit board, connected by vias, with an intermediate layer having conductive traces comprising the signal pathway 606 enclosed by the conductive surfaces and the connecting vias. As illustrated, the shielding 603b is configured to include a "U"-shaped wave trap 608 which is configured, for example by size and shape, to act as a relatively high impedance element to electrical signals varying at frequencies near operating frequencies of the radio electromagnetic body 620. This inhibits undesired electromagnetic coupling via the conductive enclosure at these frequencies. In this manner, a voltage can be generated between the radio electromagnetic body 620 and a counterpoise 702 of the apparatus 700. Characteristics of this generated voltage can further be modified via the impedance path 631, 640 and 632 bridging the wave trap 608. The impedance of optional coupling element 710 of the apparatus 700 can also influence characteristics of the generated voltage, and the impedance of optional coupling element 710 can be configured for this purpose. This generated voltage may be coupled to the RF radio electronics inside the enclosure 620.

The radio electromagnetic body 620 is depicted as a conducting body surrounding the radio electronics system 630, and separated therefrom by the shielding means 635. The radio electromagnetic body 620 can therefore define a cavity within which the radio electronics system 630 is contained. The shielding means 635, the interior of the radio electromagnetic body 620, and the conductive enclosures 603a, 703 and 603b, along with the external shielding of the mating connectors 607a, 707b, 707a and 607b operate together as a Faraday cage which can operate to substantially electromagnetically isolate the radio electromagnetic body 620 from the radio electronics system 630 and the signal pathway 606.

For purposes of impedance matching between the radio electromagnetic body 620 and the transmission line 631, an electromagnetic coupling between the radio electromagnetic body 620 and the counterpoise 702, having a predetermined impedance, may be required. For example, selected inductance or capacitance may be required in series or parallel or a combination thereof between some or all of the transmission line 631, radio electromagnetic body 620, and counterpoise 702. An antenna matching element 640 is provided for this purpose, providing an electrical or electromagnetic coupling between the transmission line 631, the radio electromagnetic body 620, and the counterpoise 702 which is configured to provide an efficient coupling between the radio electromagnetic body 620 and the transmission line 631 as would be understood by a worker skilled in the art. The antenna matching element 640 is operatively coupled to the counterpoise 702 via an electrical connection including conductor 632 coupling the antenna matching element 640 to the conductive enclosure 603b on the side of the wave trap 608 opposite the radio electronics system 630. The combination of transmission line 631, matching element 640, and conductor 632 therefore establishes a bridge across the wave trap 608 having a prespecified impedance. Optionally, this bridge can also supply a ground reference for the radio electronics system 630, the ground reference being coupled to the ground plane 602 and/or counterpoise 702. In one embodiment, further impedance matching may be provided via optional coupling element 710.

The apparatus 700 includes the mating sections 707a and 707b, the conductive enclosure 703, and conductors or other transmission means for supporting signal propagation along the signal pathway 606. At least a portion of the conductive enclosure 703 and conductors of the signal pathway can be provided as a flexible cable such as a USB cable having a mating section 707b such as a USB connector at one end. The conductive enclosure 703 may be a braided cable shielding surrounding conductive wires of the signal pathway 606. The apparatus 700 further includes a housing 720 including the counterpoise 702 and mating section 707a. The housing 720 can further operate as a stand for engaging and holding the radio communication device 610 in a desired position. The mating section 707a may be incorporated into a supportive plug or slot for this purpose.

In embodiments of the present invention, the counterpoise 702 may be electromagnetically coupled to the conductive enclosure 703 through optional coupling element 710, which may include direct electrical connection, inductive or capacitative connection, or a combination thereof. The counterpoise electromagnetically couples with the radio electromagnetic body 620 to provide monopole antenna operation as would be readily understood by a worker skilled in the art.

In one embodiment, the apparatus 700 further comprises a wave trap such as a ferrite bead 715 around a portion of the conductive enclosure 703. This wave trap can be configured to substantially impede electromagnetic coupling along conductive enclosure 703 and/or the signal pathway 606 at one or more frequencies. For example, the ferrite bead 715 can be positioned at a distance from the radio electromagnetic body 620 of about one quarter of a wavelength of an operating frequency of the radio communication apparatus 610.

Example 4

FIGS. 7A to 7F illustrate several alternative embodiments for the shape and orientation of an internal conductive enclosure of the radio communication apparatus including a wave trap or RF isolator 808a-808f between the coupling and counterpoise apparatus 800 and the antenna body 810. In each case, the conductive enclosure is configured to operate as a wave trap at predetermined radio frequencies corresponding to frequencies of operation of the antenna associated with the radio electromagnetic body. The embodiments 808a, 808b, and 808f, the "Flat U" "Flat S" and "Direct" traps, respectively, can be oriented within the plane of a printed circuit board (PCB) associated with the radio electronics, and therefore have the advantage of being realizable on the same PCB. The remaining embodiments 808c-808e, the "Edge U", "Edge S" and "Helix Trap", respectively, can be realized using other construction methods, such as employing flexible PCB material, hard line or external components, metal in plastic and injection moulding techniques, as would be understood by a worker skilled in the art.

In some embodiments, the conductive enclosures 808a-808f can operate as wave traps or isolators, for example according to the principle of a meander line, as would be understood by a worker skilled in the art. While the embodiments of 808b and 808d can have shorter lengths than the other embodiments, they can still exhibit sufficient inductance to operate as a wave trap for the purposes of the present invention. For example, the embodiments of 808b and 808d can operate as a wave trap for a higher range of operating frequencies of the radio communication apparatus. An advantage of the "S" shaped conductive enclosures 808b and 808d is that they can enable the coupling element, and therefore of the entire radio communication device, to be substantially compact.

Since the structures depicted in FIG. 7 can be short with respect to a quarter of a wavelength of the highest RF operating frequency, the outside surface of the RF isolator can act substantially as a series inductor between the counterpoise and the radio electromagnetic body. In this situation a transmission line can be connected between the coupling and counterpoise apparatus and the radio module, for example coupling the radio electronics system and and/or the radio electromagnetic body with the counterpoise at a predetermined impedance.

In some embodiments, the wave traps or isolators defined by the shaped conductive enclosures, such as illustrated in FIGS. 7A to 7F as 808a-808f, can operate by providing an electrical pathway having an inductance which can result in a sufficiently high electrical impedance at frequencies of operation of the antenna. The inductance can be provided by the interaction of portions of the wave traps or isolators, associated for example with an electromagnetic field being generated in the conductive portions and gaps defined by the wave traps or isolators, as would be readily understood by a worker skilled in the art.

Figure 7A:
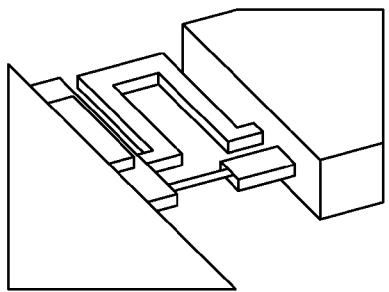
FIGS. 7A to 7F illustrate internal conductive enclosures of a radio communication apparatus configured as a wave trap between the coupling and counterpoise apparatus and an antenna body according to various embodiments of the present invention.
Figure 7A:
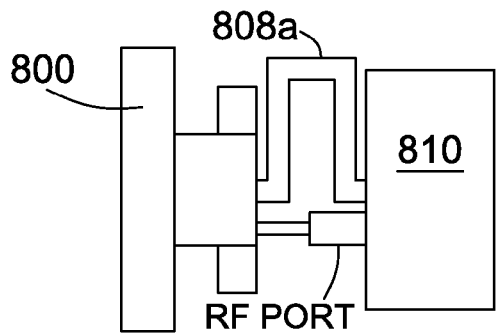
Figure 7B:
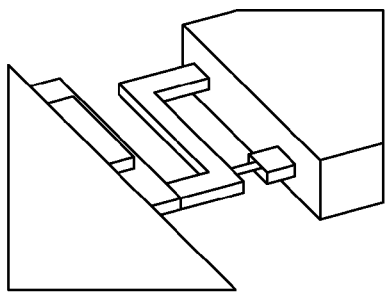
Figure 7B:
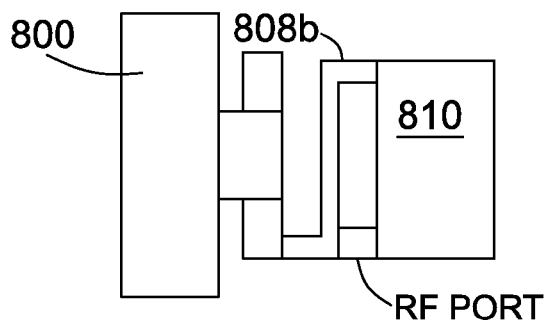
Figure 7C:
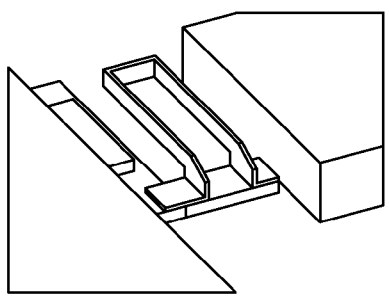
Figure 7C:
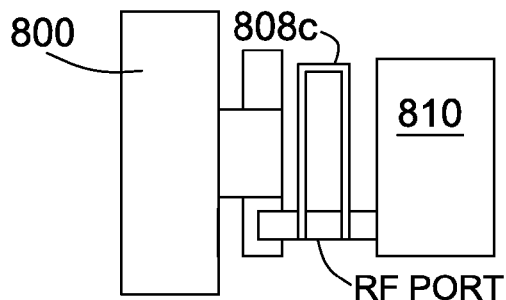
Figure 7D:
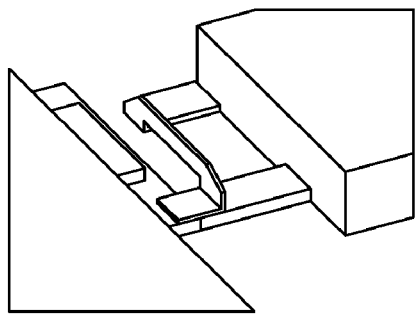
Figure 7D:
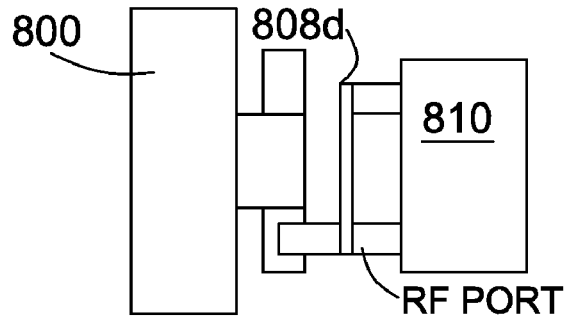
Figure 7E:
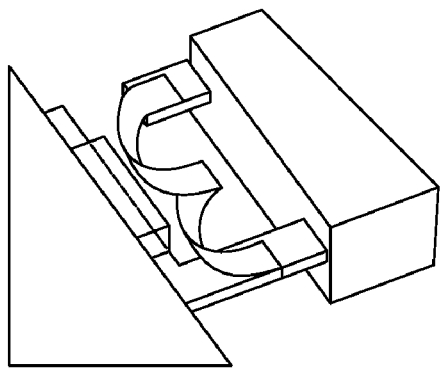
Figure 7E:
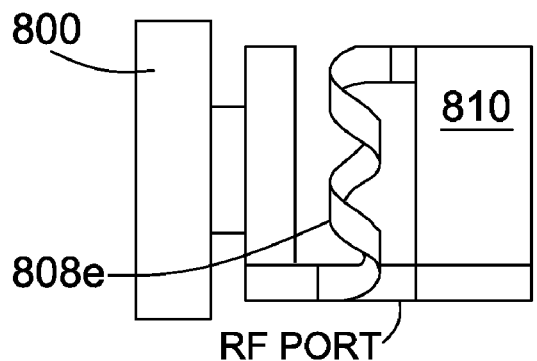
Figure 7F:
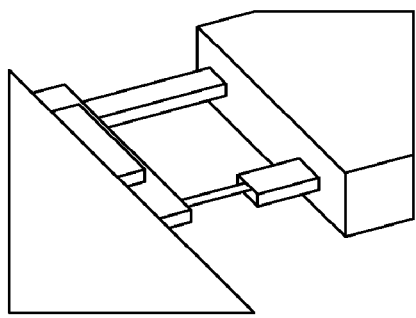
Figure 7F:
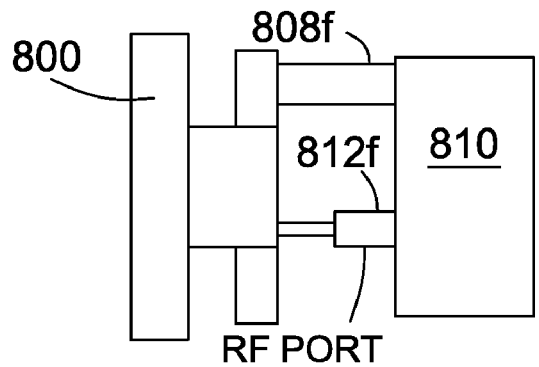

In some embodiments, the coupling element is further configured to conduct heat between the radio communication apparatus and the coupling and counterpoise apparatus. This can facilitate operation of radio communication apparatus by providing heat sinking capabilities for the radio module. For example, the conductive enclosure can be configured to conduct heat, or the coupling element can include an additional material that is not electrically conductive but provides thermal conduction or heat transfer. Testing has indicated that there is little degradation in performance due to the inclusion of heat transfer material in the coupling body. In addition, there is a direct correspondence between the width of the coupling element, and the capacity for heat transfer of the coupling element. For example, in one embodiment, the smaller the gap between the radio electronics and a USB connector, the better will be the heat transfer between the two. In some embodiments, therefore, the selection of a narrower coupling element, for example as facilitated by the conductive enclosures 808b, 808d and 808f as illustrated in FIGS. 7B, 7D and 7F, respectively, can be desirable to increase heat transfer between the radio module and the coupling and counterpoise apparatus. The coupling and counterpoise apparatus may further be configured to transfer heat to the host computer system by including a heat transferring material along the signal pathway.

Figure 8:
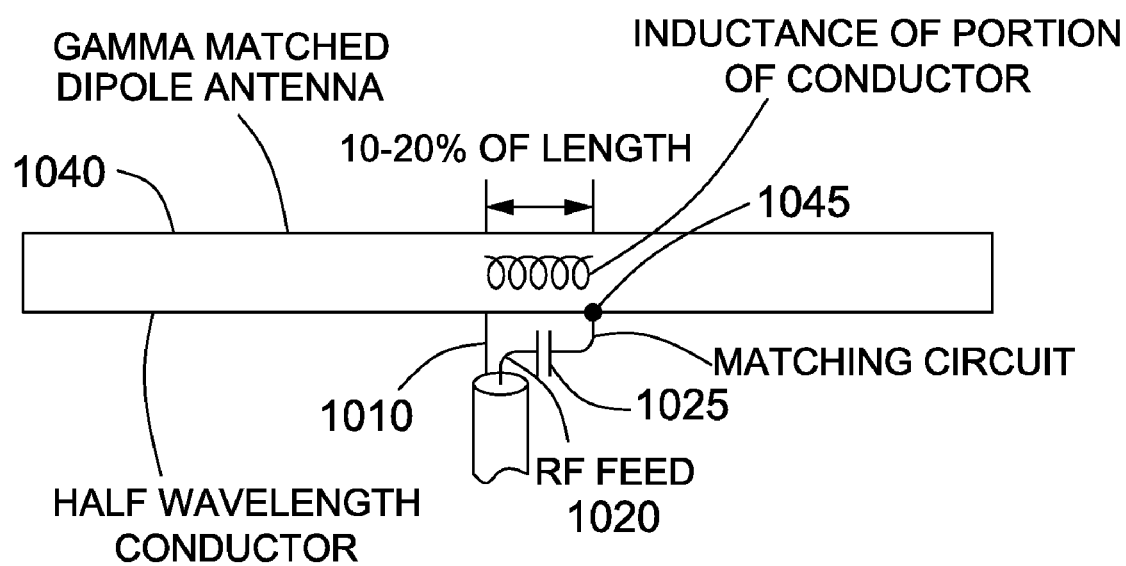
FIG. 8 illustrates a gamma matched dipole antenna.

FIG. 7F illustrates a direct or substantially straight conductive enclosure portion 808f and antenna matching circuit or RF port 812f providing a desired electrical impedance for coupling the radio electromagnetic body and counterpoise. In operation, the direct conductive enclosure portion 808f and antenna matching circuit or port 812f can facilitate impedance of undesired electromagnetic coupling via the conductive enclosure in a manner similar to that of a gamma matched dipole antenna, for example as illustrated in FIG. 8. As illustrated, a transmission line comprising a ground portion 1010 and a feed portion 1020 are coupled to the dipole 1040. The ground portion 1010 is connected to the dipole antenna 1040 at its center, while the feed portion 1020 is connected to the dipole antenna 1040 at connection point 1045 which is offset from the dipole center by 10% to 20% of the dipole length. The feed portion may be connected via a matching circuit 1025. The inductance of the portion of the dipole 1040 between its center and connection point 1045 enables a voltage to be generated between these two points for coupling to the transmission line. In FIG. 7F, the direct conductive enclosure portion 808f operates analogously to the gamma match ground portion 1010, while the matching circuit or port 812f is offset from the ground connection analogously to the offsetting of the gamma match feed portion 1020. That is, the direct conductive enclosure portion 808f attached to the radiating body 810 provides an inductance which facilitates antenna operation, simultaneously impeding undesired electromagnetic coupling between the radio electromagnetic body and the host electromagnetic body via the conductive enclosure portion 808f, and facilitating a desired electromagnetic coupling therebetween. Moving the locations of conductive enclosure portion 808f and antenna matching circuit or port 812f can be performed to adjust this impedance if desired, as would readily be understood by a worker skilled in the art.

Figure 9A:
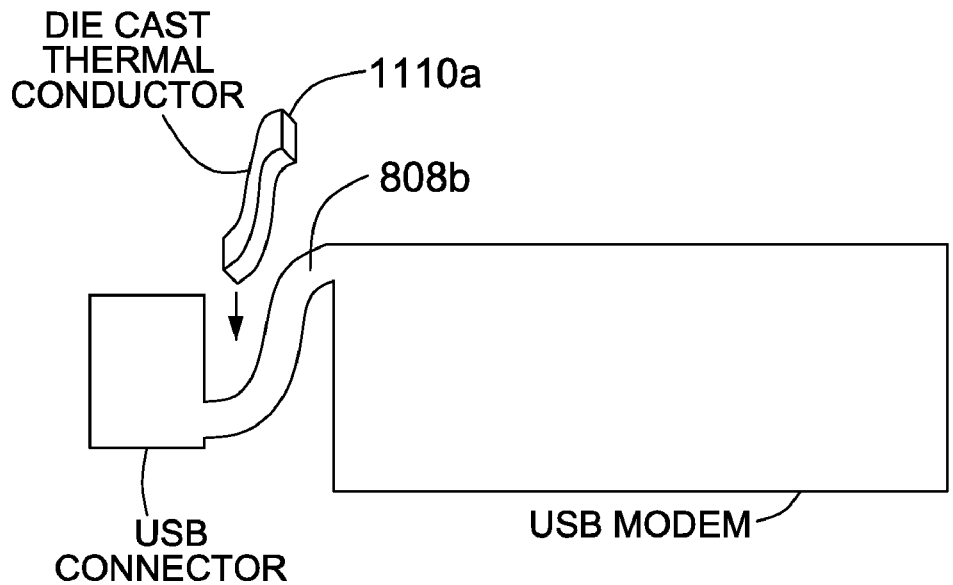
FIGS. 9A and 9B illustrate a thermally conductive element coupled to internal conductive enclosures of a radio communication apparatus in accordance with embodiments of the present invention.
Figure 9B:
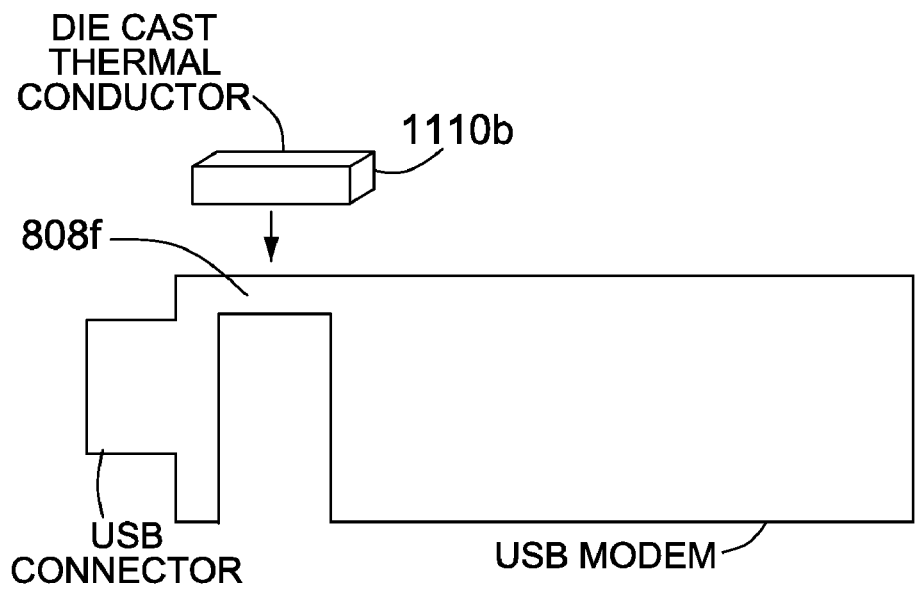

In some embodiments, heat conduction can be facilitated by soldering or otherwise attaching a thermally conductive element to the conductive enclosure and/or external portions of the signal pathway. For example, thermally conductive elements made of copper or aluminum alloy can be provided, either formed by die-casting, extrusion, or other methods. In one embodiment, a thermally conductive grease, paste or adhesive can be applied between the thermally conductive element and the conductive enclosure to facilitate heat transfer. For example, FIGS. 9A and 9B illustrate die-cast or other thermally conductive elements 1110A and 1110B for attachment to portions of internal conductive enclosures 808B and 808F, respectively, of the radio communication apparatus.

It is obvious that the foregoing embodiments of the invention are examples and can be varied in many ways. Such present or future variations are not to be regarded as a departure from the spirit and scope of the invention, and all such modifications as would be obvious to one skilled in the art are intended to be included within the scope of the following claims.

We claim:

1. An apparatus for coupling a radio communication device to a host system, the radio communication device including a radio electromagnetic body and a radio electronics system, the apparatus comprising:
    a) a housing including a counterpoise, said counterpoise operatively coupled to the radio electromagnetic body; and
    b) a signal pathway operatively coupling the radio electronics system to the host system, the signal pathway including one or more conductors contained inside a conductive enclosure, the conductive enclosure configured to provide electromagnetic isolation between the signal pathway and the radio electromagnetic body,
    wherein the apparatus is configured for removable coupling to the radio communication device, the apparatus thereby providing a counterpoise for the radio communication device which is external to the host system and to the radio communication device when the apparatus is coupled between the radio communication device and the host system, and wherein the counterpoise is conductively coupled to the radio electromagnetic body at least in part via the conductive enclosure and via a coupling having a predetermined impedance.

2. The apparatus according to claim 1, wherein the housing further comprises a clip, the clip adapted to attach the housing to an object.

3. The apparatus according to claim 2, wherein the counterpoise is integral to the clip.

4. The apparatus according to claim 1, wherein the signal pathway includes a radio interface and a host interface.

5. The apparatus according to claim 4, wherein the radio interface is a connector configured for connecting elements of the signal pathway to corresponding elements of the radio communication device, and wherein the counterpoise is operatively coupled to the radio communication device at least in part through the radio interface.

6. The apparatus according to claim 5, wherein the counterpoise is further operatively coupled to a ground reference of the host system.

7. The apparatus according to claim 4, wherein the counterpoise is operatively coupled to the radio electromagnetic body at least in part through electromagnetic field interaction.

8. The apparatus according to claim 1, wherein the counterpoise is configured to facilitate operation of a predetermined type of radio communication device.

9. The apparatus according to claim 8, wherein the radio electromagnetic body is a monopole antenna element.

10. The apparatus according to claim 1, wherein the radio communication device includes an internal signal pathway including one or more conductors contained inside a device conductive enclosure, the internal signal pathway operatively coupled to the signal pathway, the device conductive enclosure configured for conductive coupling to the conductive enclosure and configured therewith to provide electromagnetic isolation between the internal signal pathway and the radio electromagnetic body.

11. The apparatus according to claim 10, wherein the device conductive enclosure is conductively coupled to the radio electromagnetic body, wherein the coupling having the predetermined impedance comprises a wave trap integral to the device conductive enclosure, and wherein the wave trap is configured to at least partially impede coupling of the radio electromagnetic body and the counterpoise through the device conductive enclosure at one or more operating frequencies of the radio communication device.

12. The apparatus according to claim 1, wherein the counterpoise is configured to operate over a predetermined bandwidth including an operational bandwidth of the radio communication device.

13. The apparatus according to claim 1, wherein the signal pathway includes a power pathway for supplying power to the radio communication device from the host system.

14. The apparatus according to claim 1, wherein the signal pathway includes a ground pathway for providing a ground reference to the radio communication device from the host system, and wherein the counterpoise is configured for operative coupling to the antenna at least in part through the ground pathway.

15. The apparatus according to claim 1, wherein the signal pathway includes a data pathway for communication between the radio communication device and the host system.

16. The apparatus according to claim 1, wherein the signal pathway is a Universal Serial Bus (USB) pathway.

17. The apparatus according to claim 1, wherein the housing includes a stand for holding the radio communication device in a desired position.

18. The apparatus according to claim 1, wherein the signal pathway is conductively operatively coupled to the radio communication device.

19. The apparatus according to claim 1, wherein the signal pathway conveys baseband signals between the radio communication device and the host system, and wherein the radio electronics system converts between radiofrequency signals and said baseband signals.

20. The apparatus according to claim 10, wherein the signal pathway includes a radio interface configured for removable coupling with a mating device interface of the radio communication device, the radio interface and the device interface configured for conductively coupling the signal pathway with the internal signal pathway, said internal signal pathway operatively coupled between the device interface and the radio electronics system, and wherein the device conductive enclosure is conductively coupled with the conductive enclosure via the radio interface and the device interface.

21. The apparatus according to claim 20, wherein the counterpoise is further conductively connected with the radio electromagnetic body at least in part via a wave trap in series with the conductive enclosure.

\* \* \* \* \*